（12）United States Patent
Flores Pazos et al.

(10) Patent No.: US 12,308,849 B2
(45) Date of Patent: May 20, 2025

(54) FREQUENCY SYNTHESIS USING A FREQUENCY DIVIDING CIRCUIT

(71) Applicants: STMICROELECTRONICS INTERNATIONAL N.V., Geneva (CH); CENTRE NATIONAL DE LA RECHERCHE SCIENTIFIQUE, Paris (FR); INSTITUT POLYTECHNIQUE DE BORDEAUX, Talence (FR); UNIVERSITE DE BORDEAUX, Bordeaux (FR)

(72) Inventors: Denis Michael Flores Pazos, Grenoble (FR); Andreia Cathelin, Laval (FR); Yann Deval, Lege Cap-Ferret (FR)

( * ) Notice: Subject to any disclaimer, the term of this patent is extended or adjusted under 35 U.S.C. 154(b) by 0 days.

(21) Appl. No.: 18/345,298

(22) Filed: Jun. 30, 2023

(65) Prior Publication Data
US 2025/0007526 A1 Jan. 2, 2025

(51) Int. Cl.
*H03L 7/18* (2006.01)
*H03L 7/099* (2006.01)

(52) U.S. Cl.
CPC .......... *H03L 7/1806* (2013.01); *H03L 7/0992* (2013.01)

(58) Field of Classification Search
CPC ......... H03L 7/099; H03L 7/18; H03L 7/1976; H03L 7/093; H03L 2207/50; H03L 7/0991; H03L 7/085; H03L 7/087; H03L 2207/06; H03L 7/081; H03L 7/0995; H03L 7/0891; H03L 7/0996; H03L 7/1974; H03L 7/0992; H03L 7/183; H03L 7/091; H03L 7/0994; H03L 7/113; H03L 7/0998; H03L 7/08; H03L 7/14; H03L 7/07; H03L 7/197; H03L 7/16; H03L 7/0898; H03L 7/193; H03L 7/189; H03L 7/187; H03L 7/199; H03L 7/0802; H03L 7/089; H03L 7/23; H03L 7/0814; H03L 7/104; H03L 7/1072; H03L 7/107; H03L 7/0893; H03L 7/0997;
(Continued)

(56) References Cited

U.S. PATENT DOCUMENTS 5,055,800 A 10/1991 Black et al.
5,588,145 A 12/1996 Wishneusky
(Continued)

FOREIGN PATENT DOCUMENTS

EP 0665651 A2 8/1995

*Primary Examiner* — John W Poos
(74) *Attorney, Agent, or Firm* — ALSTON & BIRD LLP

(57) ABSTRACT

In various embodiments, a frequency dividing circuit is provided. The frequency dividing circuit may include a first circuit including an m-bit multiplexer configured to receive a positive binary word and a negative binary word as inputs. The frequency dividing circuit may receive a controlled oscillator output signal and a complement of the controlled oscillator output signal, generate a frequency dividing circuit output signal from the controlled oscillator output signal and the complement of the controlled oscillator output signal using the positive binary word and the negative binary word. A ratio of the frequency dividing circuit output signal frequency to the controlled oscillator output signal frequency is a decimal value greater than zero and less than one and is determined using a ratio of a value of the positive binary word to a sum of the value of the positive binary word and an absolute value of the negative binary word.

20 Claims, 7 Drawing Sheets

(58) Field of Classification Search
CPC ....... H03L 7/1075; H03L 7/1978; H03L 7/10; H03L 7/181; H03L 7/1806; H03L 1/022; H03L 7/095; H03L 7/148; H03L 7/06; H03L 7/0805; H03L 7/0807; H03L 7/103; H03L 7/235; H03L 7/00; H03L 7/0896; H03L 1/027; H03L 2207/10; H03L 7/0816; H03L 7/097; H03L 7/191; H03L 7/22; H03L 7/101; H03L 1/00; H03L 1/023; H03L 1/026; H03L 1/04; H03L 3/00; H03L 7/0812; H03L 7/146; H03L 7/24; H03L 1/025; H03L 2207/05; H03L 7/0818; H03L 7/102; H03L 7/141; H03L 7/185; H03L 7/26; H03C 3/0933; H03C 3/0941; H03C 3/0925; H03C 3/0958; H03C 3/0991; H03C 3/0966; H03C 3/095; H03C 5/00; H03C 3/0975; H03C 3/227; H03C 3/0908; H03C 3/22; H03C 1/60; H03C 2200/0029; H03C 2200/005; H03C 2200/0054; H03C 3/09; H03C 3/225; H03C 3/40

See application file for complete search history.

(56) References Cited

U.S. PATENT DOCUMENTS

| | | | |
|---|---|---|---|
| 5,742,191 A | 4/1998 | Romesburg et al. | |
| 6,031,428 A | 2/2000 | Hill | |
| 6,236,278 B1 | 5/2001 | Olgaard | |
| 7,577,225 B2 * | 8/2009 | Azadet | H03L 7/0995 375/376 |
| 10,862,427 B1 * | 12/2020 | Chan | H03C 3/0966 |
| 2005/0046492 A1 | 3/2005 | Mallinson | |
| 2005/0280473 A1 * | 12/2005 | Puma | H03C 3/0925 331/16 |
| 2007/0066261 A1 * | 3/2007 | Haralabidis | H03L 7/1978 455/76 |
| 2007/0188357 A1 | 8/2007 | Mallinson | |

* cited by examiner

FREQUENCY SYNTHESIS USING A FREQUENCY DIVIDING CIRCUIT

TECHNICAL FIELD

Example embodiments of the present disclosure relate generally to the field of signal generation and in particular frequency dividing circuits and methods, for example as used in frequency synthesizers.

BACKGROUND

Signal generation such as frequency synthesis is used in applications such as telecommunications, Internet of Things (IoT) devices, wireless communications, near filed communications (NFC), etc. Frequency synthesis circuits may be implemented using Integrated Circuits (ICs). Applicant has identified many technical challenges and difficulties associated with signal generation such as in frequency synthesis. Through applied effort, ingenuity, and innovation, Applicant has solved problems related to signal generation such as in frequency synthesis by developing solutions embodied in the present disclosure, which are described in detail below.

BRIEF SUMMARY

In various embodiments, a frequency synthesizer is provided. The frequency synthesizer includes a controlled oscillator (CO) configured to generate an oscillator output signal controlled by an input control signal and a complement of the oscillator output signal. The frequency synthesizer also includes a frequency dividing circuit configured to receive the CO output signal and the complement of the CO output signal, receive a positive binary word and a negative binary word, and generate a frequency dividing circuit output signal from the CO output signal and the complement of the CO output signal using the positive binary word and the negative binary word, where a ratio of the frequency dividing circuit output signal frequency to the CO output signal frequency is a decimal value greater than zero and less than one and is determined using a ratio of a value of the positive binary word to a sum of the value of the positive binary word and an absolute value of the negative binary word.

The frequency dividing circuit may include a first circuit, the first circuit includes an m-bit multiplexer configured to receive the positive binary word and the negative binary word as inputs, and receive a control signal for selecting the positive binary word or the negative binary word to be provided on an output of the m-bit multiplexer, where each of the positive binary word and the negative binary word comprise m bits.

The first circuit may include an m-bit data register configured to receive the output of the m-bit multiplexer as an input of the m-bit data register, receive a clock, where the clock frequency is the same as the CO output signal frequency and the clock phase is the same as the CO output signal phase, generate an output of the m-bit data register using a value of the input of the m-bit data register at a corresponding rising edge of the clock to the value of the input of the m-bit data register, and hold the output of the m-bit data register at the value of the input of the m-bit data register at the corresponding rising edge of the clock to the value of the input of the m-bit data register for a time period of the clock.

The frequency dividing circuit may further include a second circuit. The second circuit may include an adder circuit and an m-bit flip-flop, where the adder circuit is configured to receive the output of the m-bit data register as a first input of the adder circuit, receive a modified version of an output of the adder circuit as a second input of the adder circuit, and add the first input of the adder circuit to the second input of the adder circuit to generate the output of the adder circuit. The m-bit flip flop may be configured to receive the output of the adder circuit, receive the clock, and generate the modified version of the output of the adder circuit by holding a value of the output of the adder circuit at a corresponding rising edge of the clock to the value of the output of the adder circuit for the time period of the clock.

In various embodiments, the control signal is the most significant bit (MSB) of the output of the adder circuit.

The frequency dividing circuit may also include a third circuit. The third circuit may include a flip flop configured to receive the clock and receive the control signal as an input of the flip flop, and generate an output of the flip flop using a value of the control signal at a corresponding rising edge of the clock to the value of the control signal and by holding the output of the flip flop at the value of the control signal at the corresponding rising edge of the clock to the value of the control signal for the time period of the clock. The frequency dividing circuit may also include a multiplexer configured to receive the clock and a complement of the clock as inputs, and receive the control signal for selecting the clock or the complement of the clock to be provided on an output of the multiplexer.

The third circuit may include an AND logic gate configured to receive the output of the flip flop and the output of the multiplexer and generate the frequency dividing circuit output signal by performing an AND operation between the output of the flip flop and the output of the multiplexer.

The frequency synthesizer may also include a phase locked loop configured to lock the CO output signal frequency using the frequency dividing circuit output signal and a reference signal provided to the frequency synthesizer, where the phase locked loop is configured to lock the frequency dividing circuit output signal frequency with respect to the reference signal frequency. Other technical features may be readily apparent to one skilled in the art from the following figures, descriptions, and claims.

In various embodiments, a method for frequency synthesis is provided. The method may include receiving an CO output signal and a complement of the CO output signal, receiving a positive binary word and a negative binary word, and generating a frequency dividing circuit output signal from the CO output signal and the complement of the CO output signal using the positive binary word and the negative binary word, where a ratio of the frequency dividing circuit output signal frequency to the CO output signal frequency is a decimal value greater than zero and less than one and is determined using a ratio of a value of the positive binary word to a sum of the value of the positive binary word and an absolute value of the negative binary word.

The method for frequency synthesis may also include receiving the positive binary word and the negative binary word as inputs, and receiving a control signal for selecting the positive binary word or the negative binary word to be provided on an output of an m-bit multiplexer, where each of the positive binary word and the negative binary word comprise m bits. Other technical features may be readily apparent to one skilled in the art from the following figures, descriptions, and claims.

The method for frequency synthesis may also include receiving the output of the m-bit multiplexer as an input of the m-bit data register, receiving a clock, where the clock frequency is the same as the CO output signal frequency and the clock phase is the same as the CO output signal phase, generating an output of the m-bit data register using a value of the input of the m-bit data register at a corresponding rising edge of the clock to the value of the input of the m-bit data register, and holding the output of the m-bit data register at the value of the input of the m-bit data register at the corresponding rising edge of the clock to the value of the input of the m-bit data register for a time period of the clock.

The method for frequency synthesis may also include receiving the output of the m-bit data register as a first input of an adder circuit, receiving a delayed version of an output of the adder circuit as a second input of the adder circuit, and adding the first input of the adder circuit to the second input of the adder circuit to generate the output of the adder circuit. The method for frequency synthesis may also include receiving the output of the adder circuit by an m-bit flip flop. The method for frequency synthesis may also include receiving the clock by the m-bit flip flop. The method for frequency synthesis may also include generating the modified version of the output of the adder circuit by holding a value of the output of the adder circuit at a corresponding rising edge of the clock to the value of the output of the adder circuit for the time period of the clock.

In various embodiments, the control signal is the most significant bit (MSB) from the output of the adder circuit.

The method for frequency synthesis may also include receiving the clock by a flip flop, receiving the control signal as an input of the flip flop, generating an output of the flip flop using a value of the control signal at a corresponding rising edge of the clock to the value of the control signal and by holding the output of the flip flop at the value of the control signal at the corresponding rising edge of the clock to the value of the control signal for the time period of the clock, receiving the clock and a complement of the clock as inputs of a multiplexer, and receiving the control signal for selecting the clock or the complement of the clock to be provided on an output of the multiplexer.

The method for frequency synthesis may also include generating the frequency dividing circuit output signal by performing an AND operation between the output of the flip flop and the output of the multiplexer.

The method for frequency synthesis may also include locking the frequency dividing circuit output signal frequency with respect to a reference signal frequency provided to the frequency synthesizer frequency, and determining the CO output signal frequency using the frequency dividing circuit output signal and the reference signal frequency.

In various embodiments, a frequency dividing circuit is provided. The frequency dividing circuit may include a first circuit, the first circuit includes an m-bit multiplexer configured to receive a positive binary word and a negative binary word as inputs. The frequency dividing circuit may be configured to receive a CO output signal and a complement of the CO output signal, generate a frequency dividing circuit output signal from the CO output signal and the complement of the CO output signal using the positive binary word and the negative binary word, where a ratio of the frequency dividing circuit output signal frequency to the CO output signal frequency is a decimal value greater than zero and less than one and is determined using a ratio of a value of the positive binary word to a sum of the value of the positive binary word and an absolute value of the negative binary word.

The m-bit multiplexer may be configured to receive a control signal for selecting the positive binary word or the negative binary word to be provided on an output of the m-bit multiplexer, where each of the positive binary word and the negative binary word comprise m bits, and where the first circuit further includes an m-bit data register configured to receive the output of the m-bit multiplexer as an input of the m-bit data register, receive a clock, where the clock frequency is the same as the CO output signal frequency and the clock phase is the same as the CO output signal phase, generate an output of the m-bit data register using a value of the input of the m-bit data register at a corresponding rising edge of the clock to the value of the input of the m-bit data register, and hold the output of the m-bit data register at the value of the input of the m-bit data register at the corresponding rising edge of the clock to the value of the input of the m-bit data register for a time period of the clock.

The frequency dividing circuit may also include a second circuit. The second circuit may include an adder circuit and an m-bit flip-flop, where the adder circuit is configured to receive the output of the m-bit data register as a first input of the adder circuit, receive a modified version of an output of the adder circuit as a second input of the adder circuit, and add the first input of the adder circuit to the second input of the adder circuit to generate the output of the adder circuit, where the control signal is the most significant bit (MSB) of the output of the adder circuit. The m-bit flip flop may be configured to receive the output of the adder circuit, receive the clock, and generate the modified version of the output of the adder circuit by holding a value of the output of the adder circuit at a corresponding rising edge of the clock to the value of the output of the adder circuit for the time period of the clock.

The frequency dividing circuit may also include a third circuit. The third circuit may include a flip flop configured to receive the clock and receive the control signal as an input of the flip flop, and generate an output of the flip flop using a value of the control signal at a corresponding rising edge of the clock to the value of the control signal and by holding the output of the flip flop at the value of the control signal at the corresponding rising edge of the clock to the value of the control signal for the time period of the clock.

The frequency dividing circuit may also include a third circuit. The third circuit may include a multiplexer configured to receive the clock and a complement of the clock as inputs, and receive the control signal for selecting the clock or the complement of the clock to be provided on an output of the multiplexer. The third circuit includes an AND logic gate configured to receive the output of the flip flop and the output of the multiplexer and generate the frequency dividing circuit output signal by performing an AND operation between the output of the flip flop and the output of the multiplexer.

Other technical features may be readily apparent to one skilled in the art from the following figures, descriptions, and claims.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF DESCRIPTION OF THE SEVERAL VIEWS OF THE DRAWINGS

Having thus described certain example embodiments of the present disclosure in general terms, reference will now

Figure 1:
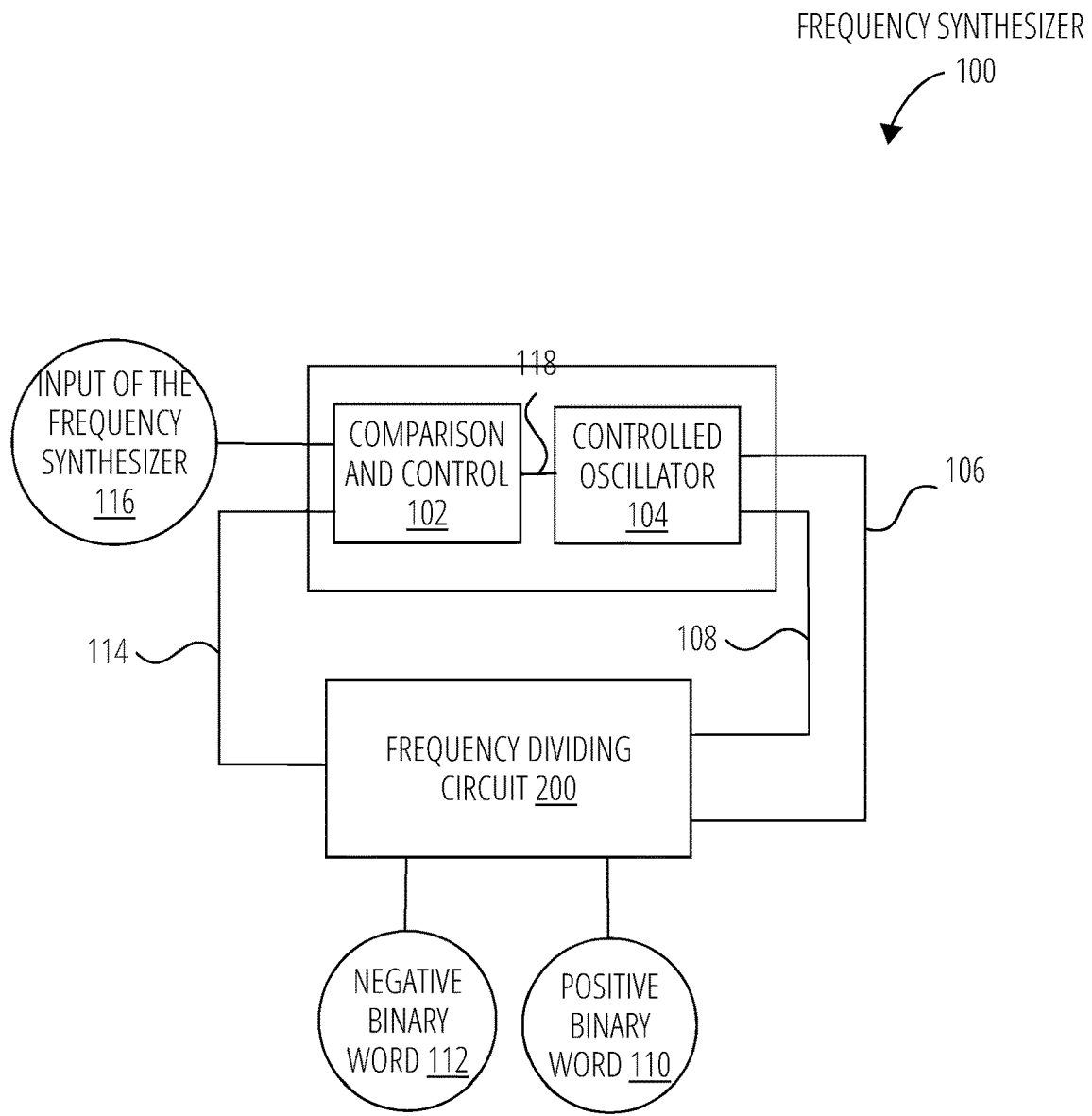

FIG. 1 illustrates a frequency synthesizer in accordance with various embodiments of the present disclosure.

Figure 2:
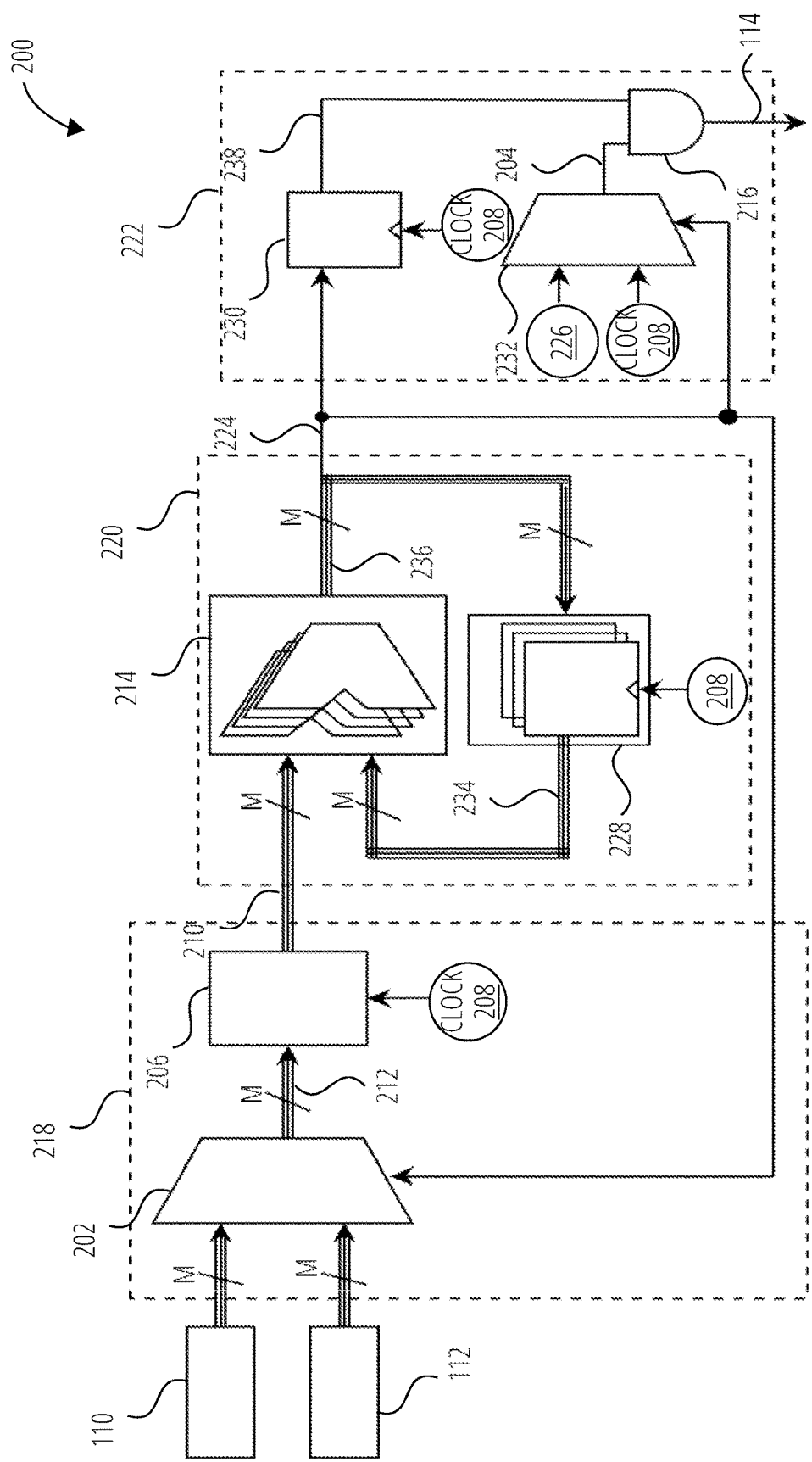

FIG. 2 illustrates a frequency dividing circuit in accordance with various embodiments of the present disclosure.

Figure 3:
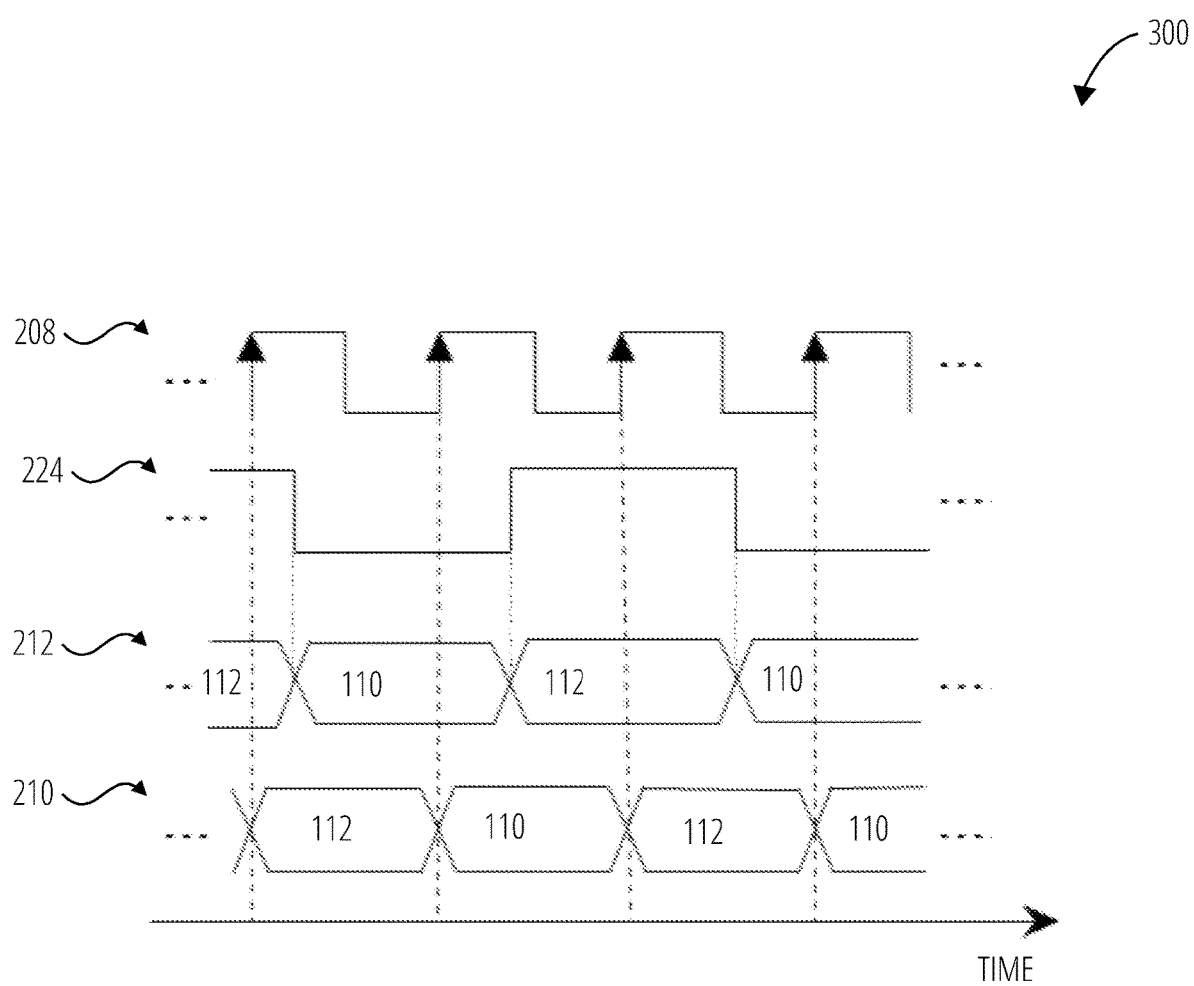

FIG. 3 illustrates various signal diagrams in accordance with various embodiments of the present disclosure.

Figure 4:
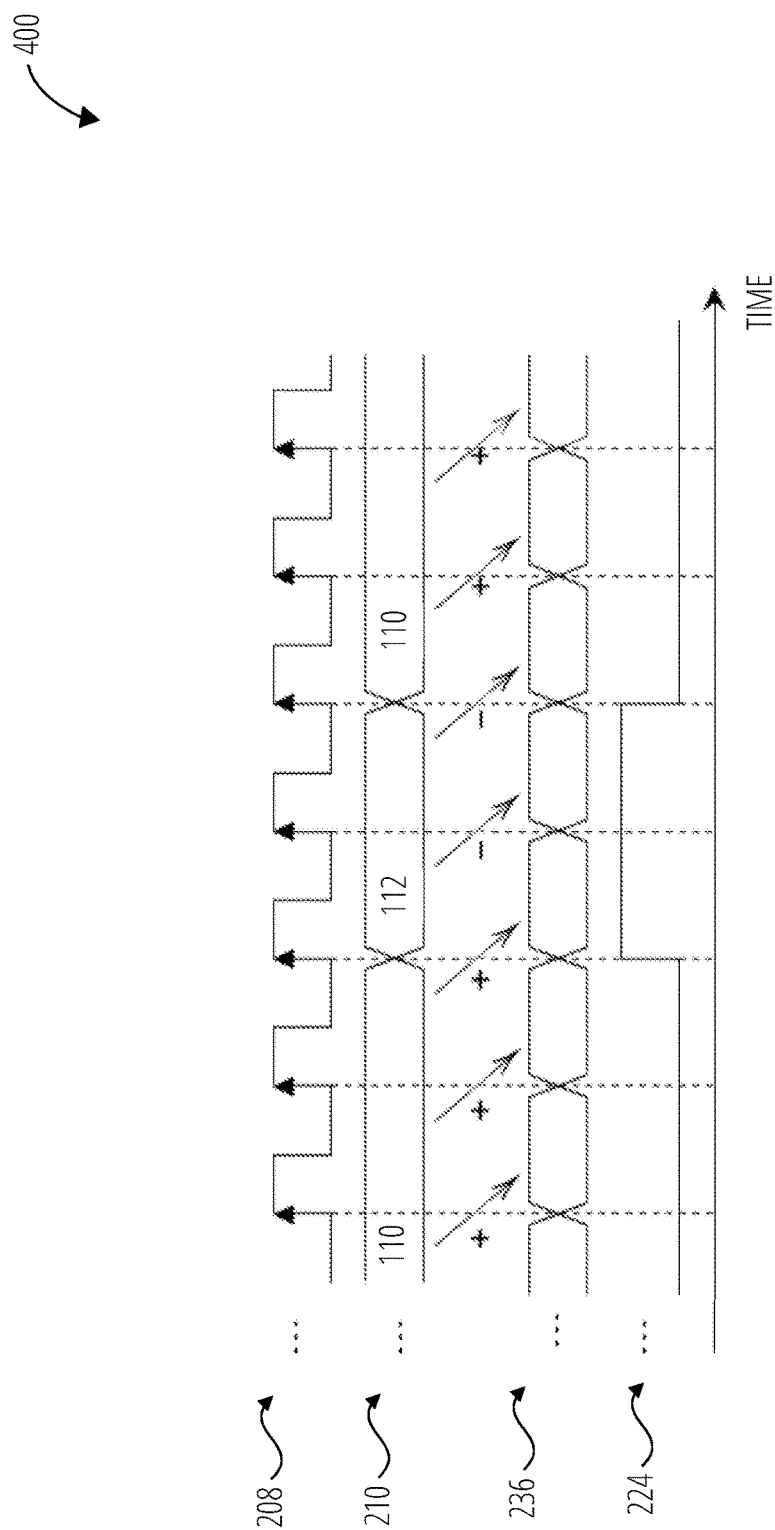

FIG. 4 illustrates various signal diagrams in accordance with various embodiments of the present disclosure.

Figure 5:
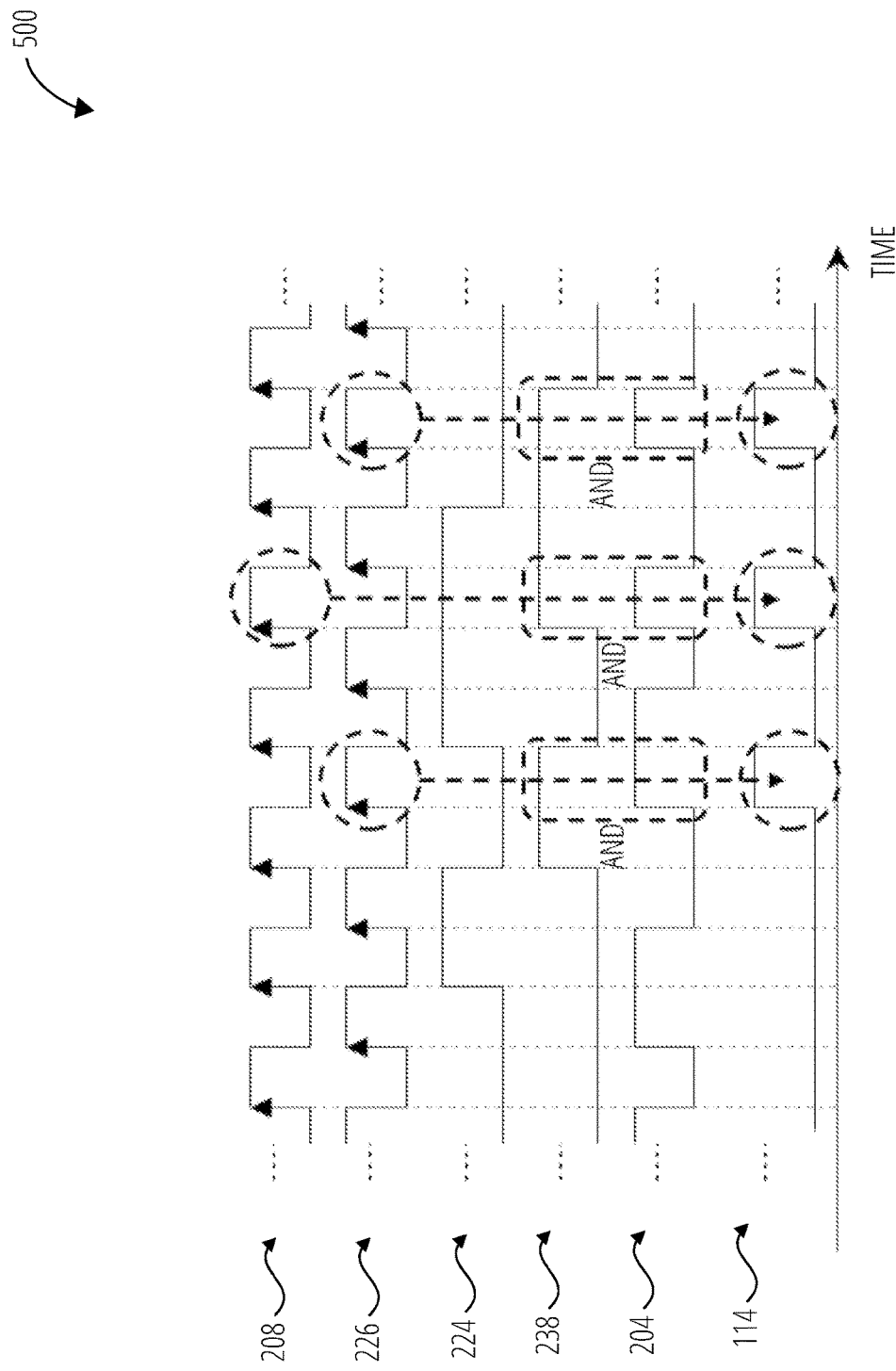

FIG. 5 illustrates various signal diagrams in accordance with various embodiments of the present disclosure.

Figure 6:
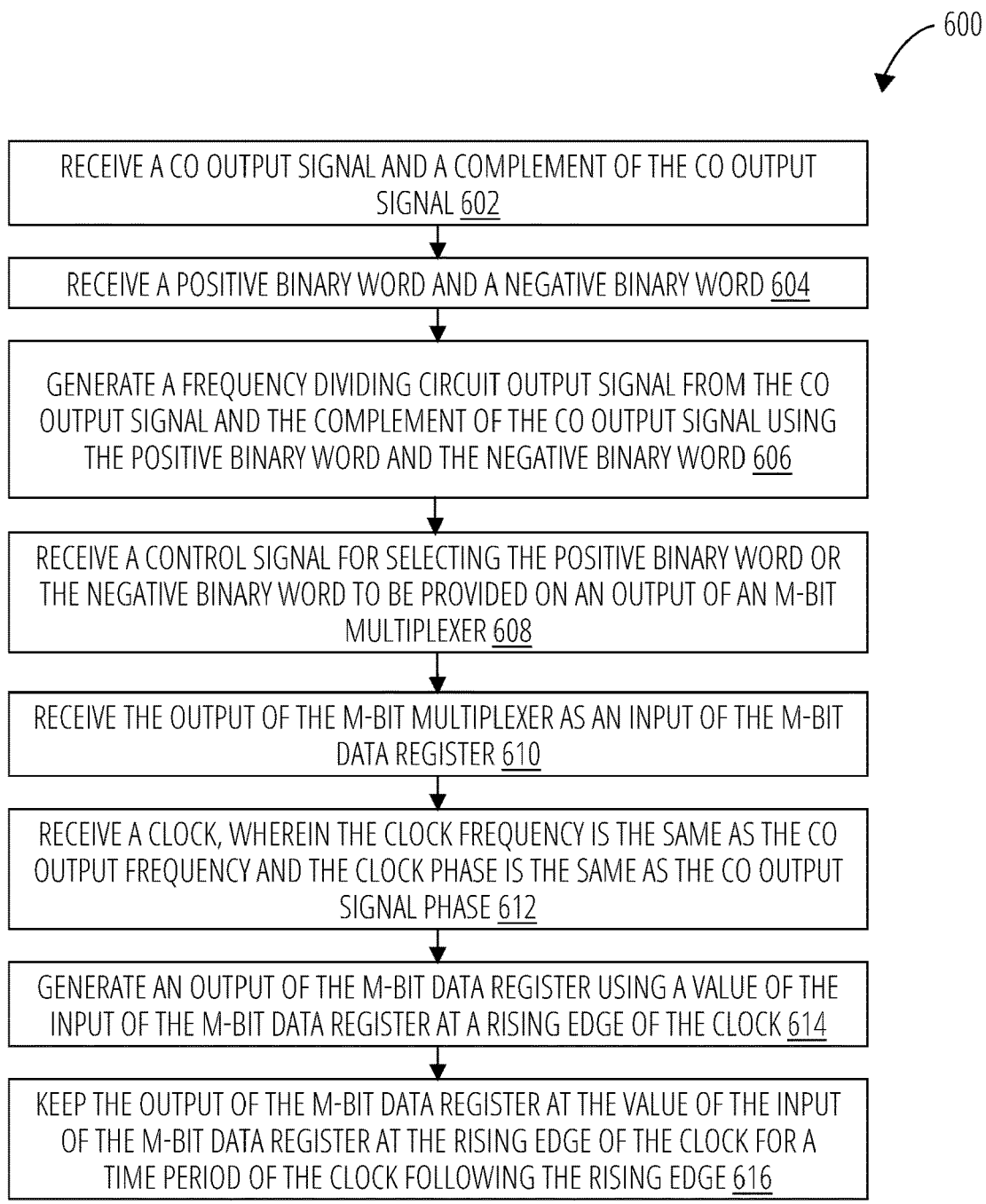

FIG. 6 illustrates a method 600 in accordance with one embodiment.

Figure 7:
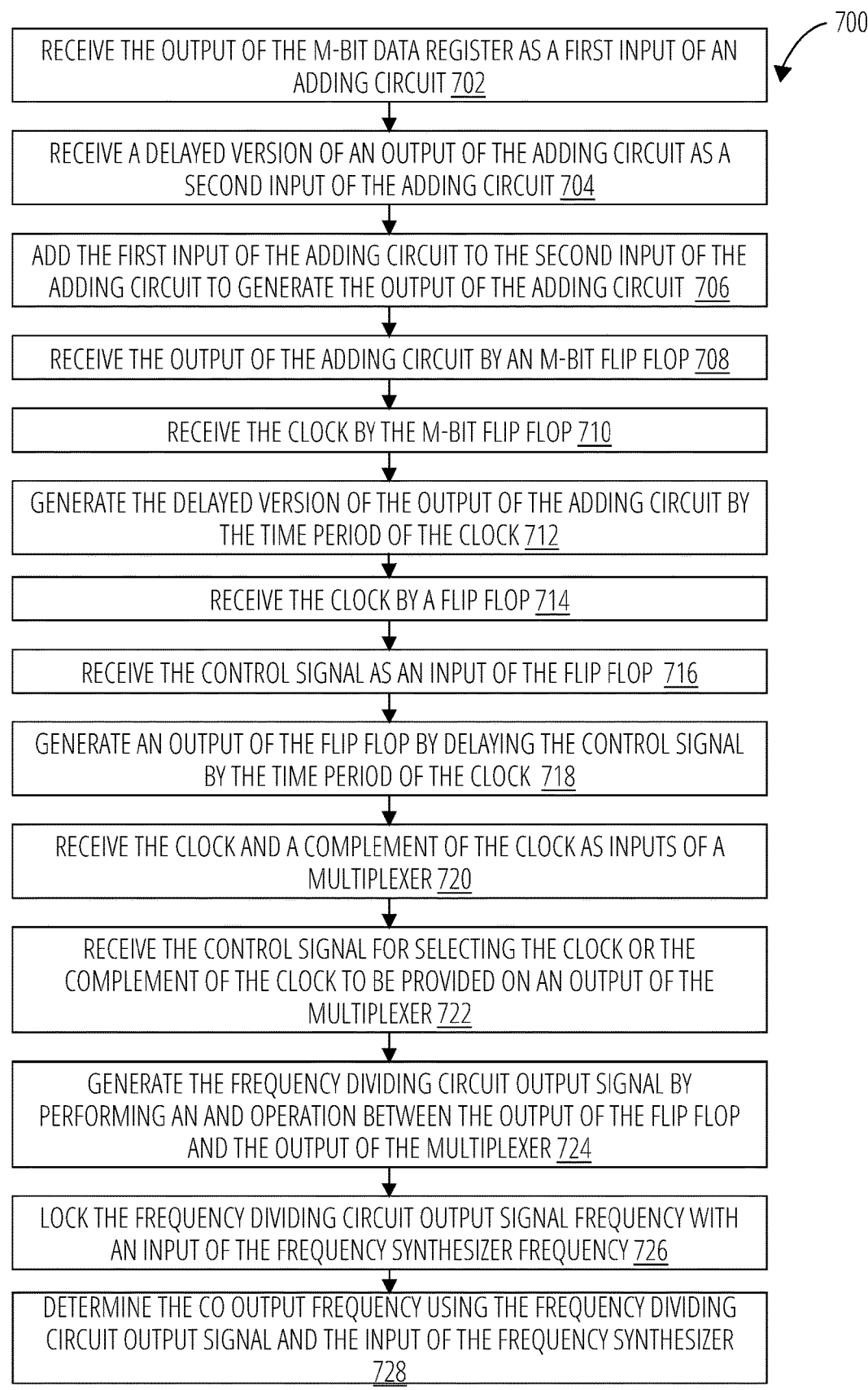

FIG. 7 illustrates a method 700 in accordance with one embodiment.

DETAILED DESCRIPTION

Embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Other technical features may be readily apparent to one skilled in the art from the following figures, descriptions, and claims. Like reference numerals refer to like elements throughout.

In various wireless communications applications, specific carrier frequencies may be required to be generated for carrying information in various channels with varying frequency requirements. To achieve a desired frequency from an oscillation signal generated by for example a crystal-based oscillator, a frequency synthesizer with fractional ratio having high-resolutions is required. In a specific application such as in BLE (Bluetooth Low Energy standard) systems, or Internet of Things (IoT) communications, in order to improve the spectral purity of a classical frequency synthesizer, fractional frequency division approach is required. Using such systems may make the system compatible with ultra-low power consumption applications and increase energy efficiency.

Various embodiments of the present disclosure provide a frequency dividing circuit. In various embodiments, the frequency dividing circuit is configured to divide a frequency with a decimal ratio. In example embodiments, using the frequency dividing circuit provide for the high-resolution frequency synthesis requirements in various applications such as those described above.

Referring now to FIG. 1, a frequency synthesizer 100 is provided in accordance with various embodiments of the present disclosure. In various embodiments, the frequency synthesizer 100 includes a comparison and control circuit 102, a controlled oscillator 104 and a frequency dividing circuit 200.

In various embodiments, the comparison and control circuit 102 may be any of an analog or a digital circuit generating a comparison and control output signal 118.

In various embodiments, the controlled oscillator 104 is configured to generate an oscillator output signal 106 and a complement of the controlled oscillator output signal 108. In various embodiments, the controlled oscillator 106 is configured to generate a range of output frequencies, for example determined by the comparison and control output signal 118. In various embodiments, the controlled oscillator simultaneously generates the controlled oscillator output signal 106 and the complement of the controlled oscillator output signal 108. In example embodiments, the controlled oscillator 104 is a voltage-controlled oscillator, however any other controlled oscillator capable of producing a range of output frequencies may be used in the various embodiments of the present disclosure.

In various embodiments, the frequency dividing circuit 200 is configured to receive the CO output signal 106 and the complement of the CO output signal. In various embodiments, the frequency synthesizers 100 is configured to receive a positive binary word 110 and a negative binary word 112. In various embodiments, each of the positive binary word 110 and negative binary word 112 include the same number of bits, for example m bits. In various embodiments, m is a non-zero integer number.

In various embodiments, the frequency dividing circuit 200 is configured to generate a frequency dividing circuit output signal 114 from the CO output signal 106 and the complement of the CO output signal 108 using the positive binary word 110 and the negative binary word 112. In various embodiments, a ratio of the frequency dividing circuit output signal 114 frequency (denoted by $f_{out}$ herein) of the CO output signal 106 frequency (which is a frequency of an input signal to the frequency dividing circuit 200 and is denoted by $f_{in}$ herein) is a decimal value greater than zero and less than one and is determined using a ratio of a value of the positive binary word to a sum of the value of the positive binary word and an absolute value of the negative binary word. For example, if S denotes the positive binary word 110 and R denotes the negative binary word 112, the ratio of $f_{out}$ to $f_{in}$ is as follows:

$$\frac{f_{out}}{f_{in}} = \frac{S}{S+|R|} \qquad \text{Eq. 1}$$

In various embodiments, the frequency synthesizer 100 may also include a comparison and control circuitry 102. The comparison and control circuitry 102 may be configured to determine the CO output signal 106 and its complement 108. For example, the comparison and control circuitry 102 may determine the CO output signal 106 frequency using the frequency dividing circuit output signal 114 and an input of the frequency synthesizer 116 (which may be referred to herein as the reference frequency or $f_{ref}$). The input of the frequency synthesizer 116 may for example be generated using a crystal oscillator. In various embodiments, the comparison and control circuitry 102 is configured to lock the frequency dividing circuit output signal 114 frequency to the input of the frequency synthesizer 116 frequency. In various embodiments, the frequency dividing circuit 200 may be used in various types of frequency synthesizers such as analog phase locked loops or all digital phase locked loops. In an example embodiment, the frequency dividing circuit 200 may be a bit rate modulator.

Referring now to FIG. 2, a schematic diagram illustrating a frequency dividing circuit 200 is provided in accordance with various embodiments of the present disclosure. In various embodiments, the frequency dividing circuit 200 includes a first circuit 218. In various embodiments, the first circuit 218 includes an m-bit multiplexer 202. The m-bit multiplexer 202 may be configured to receive the positive binary word 110 and the negative binary word 112 as inputs. In various embodiments, the m-bit multiplexer 202 receives a control signal 224 for selecting the positive binary word 110 or the negative binary word 112 to be provided on an output of the m-bit multiplexer 212. As for example illustrated in FIG. 2, each of the positive binary word 110 (S) and the negative binary word 112 (R) may comprise m bits.

In various embodiments, the first circuit 218 of the frequency dividing circuit 200 includes an m-bit data register 206. The m-bit data register 206 may be configured to receive the output of the m-bit multiplexer as an input of the m-bit data register 206. The m-bit data register 206 may also receive a clock 208. In various embodiments, the clock 208 has the same frequency as the controlled oscillator output signal 106, and the clock phase is the same as the phase of the controlled oscillator output signal 106.

In various embodiments, the m-bit data register 206 is configured to generate an output of the m-bit data register using a value of the input of the m-bit data register at a corresponding rising edge of the clock 208 to the value of the input of the m-bit data register. The m-bit data register 206 may be configured to hold the output of the m-bit data register at the value of the input of the m-bit data register at the corresponding rising edge of the clock 208 to the value of the input of the m-bit data register for a time period of the clock for a time period of the clock following the rising edge. For example, referring now to FIG. 3, a signal diagram 300 illustrating output of the m-bit multiplexer 212 and output of the m-bit data register 210 is provided in accordance with example embodiments of the present disclosure.

Referring to FIG. 3, in various embodiments, the control signal 224 is used to select one of the inputs to the m-bit multiplexer 202 and therefore to determine whether positive binary word 110 or negative binary word 112 is provided at the output of the m-bit multiplexer 212. In various embodiments, the output of the m-bit multiplexer 212 is provided to the input of the m-bit data register. In various embodiments, the output of the m-bit data register 210 is the value of the input of the m-bit data register at the rising edge of clock 208 for a time period of the clock 208 immediately following the rising edge, as for example illustrated by the signal diagram 300.

Referring to FIG. 2, in various embodiments the frequency dividing circuit 200 includes a second circuit 220. The second circuit 220 may include an adder circuit 214 and an m-bit flip-flop 228. In various embodiments, the adder circuit 214 is configured to receive the output of the m-bit data register 210 as a first input of the adder circuit, and receive a modified version of an output of the adder circuit 234 as a second input of the adder circuit. In various embodiments, the adder circuit 214 adds the first input of the adder circuit to the second input of the adder circuit to generate the output of the adder circuit 236. In various embodiments, the addition occurs at each rising edge of the clock 208.

In various embodiments, the m-bit flip-flop 228 of the second circuit 220 is configured to receive the output of the adder circuit 236, receive the clock 208, and generate the modified version of the output of the adder circuit 234 as the second input of the adder circuit. In various embodiments, the modified version of an output of the adder circuit 234 is generated by holding the value of the output of the adder circuit 236 at a corresponding rising edge of the clock to the value of the output of the adder circuit for one time period of the clock 208. For example, referring to FIG. 4, a signal diagram illustrating output of the adder circuit 236 is provided in accordance with example embodiments of the present disclosure.

Referring to FIG. 4, in various embodiments, the control signal 224 determines whether the positive binary word 110 or the negative binary word 112 are outputted on the output of the m-bit data register 210. In various embodiments, at each rising edge of the clock 208, the adder circuit 214 adds the first input of the adder circuit to the second input of the adder circuit to generate the output of the adder circuit 236.

In various embodiments, the control signal 224 is the most significant bit (MSB) in the output of the adder circuit 236.

Referring to FIG. 2, in various embodiments, the frequency dividing circuit 200 includes a third circuit 222. The third circuit 222 may include a flip flop 230, a multiplexer 232 and an AND logic gate 216.

In various embodiments, a flip flop generates an output equal to the value of the input of the flip flop at each rising edge of the clock and holds that output value for a time period of the clock following the rising edge.

In various embodiments, the flip flop 230 is configured to receive the clock 208 and receive the control signal 224 as an input of the flip flop 230. In various embodiments, the flip flop 230 is configured to generate an output of the flip flop 238 using a value of the control signal at a corresponding rising edge of the clock to the value of the control signal 224 and by holding the output of the flip flop at the value of the control signal 224 at the corresponding rising edge of the clock to the value of the control signal for the time period of the clock 208.

In various embodiments, the multiplexer 232 is configured to receive the clock 208 and a complement of the clock 226 as inputs. The multiplexer 232 may be configured to also receive the control signal 224 for selecting the clock 208 or the complement of the clock 226 to be provided on an output of the multiplexer 204.

In various embodiments, the third circuit 222 includes an AND logic gate 216. The AND logic gate 216 may be configured to receive the output of the flip flop 238 and the output of the multiplexer 204 and generate the frequency dividing circuit output signal 114 by performing an AND operation between the output of the flip flop 238 and the output of the multiplexer 204. For example, referring now to FIG. 5, a signal diagram 500 illustrating frequency dividing circuit output signal 114 is provided in accordance with example embodiments of the present disclosure.

Referring to FIG. 5, in various embodiments, the control signal 224 selects either the clock 208 or the complement of the clock 226 to be provided on the output of the multiplexer 204. In various embodiments, the output of the flip flop 238 is the delayed control signal 224 by a time period of the clock 208. In various embodiments, by performing an AND operation between the output of the flip flop 238 and output of the multiplexer 204, the frequency dividing circuit output signal 114 is generated. In various embodiments, third circuit 222 provides a more even distribution of the pulses in the frequency dividing circuit output signal 114 that may otherwise be achieved. Therefore, in various embodiments, the frequency dividing circuit 200 provides the desired frequency division as well as an even distribution of pulses in the frequency dividing circuit output signal 114.

FIG. 6 illustrates an example method 600 in providing frequency division. Although the example method 600 depicts a particular sequence of operations, the sequence may be altered without departing from the scope of the present disclosure. For example, some of the operations depicted may be performed in parallel or in a different sequence that does not materially affect the function of the method 600. In other examples, different components of an example device or system that implements the method 600 may perform functions at substantially the same time or in a specific sequence. In various embodiments, various blocks of the described methods may be performed using various aspects of the frequency dividing circuit 200 for example with reference to FIG. 1 to FIG. 5.

According to some examples, the method includes receiving an oscillator output signal 106 and a complement of the oscillator output signal 108 at block 602. According to some examples, the method includes receiving a positive binary word 110 and a negative binary word 112 as inputs at block 604.

According to some examples, the method includes generating a frequency dividing circuit output signal 114 from the CO output signal 106 and the complement of the CO output signal 108 using the positive binary word 110 and the negative binary word 112. In some examples, a ratio of the frequency dividing circuit output signal 114 frequency to the oscillator output signal 106 frequency is a decimal value greater than zero and less than one. In some examples, the ratio is determined using a ratio of a value of the positive binary word 110 to a sum of the value of the positive binary word 110 word and an absolute value of the negative binary word 112 at block 606 and for example as described by Eq. 1.

According to some examples, the method includes receiving a control signal 224 for selecting the positive binary word 110 or the negative binary word 112 to be provided on an output of an m-bit multiplexer 202 at block 608. According to some examples, each of the positive binary word 110 and the negative binary word 112 comprise m bits.

According to some examples, the method includes receiving the output of the m-bit multiplexer 212 as an input of the m-bit data register 206 at block 610. According to some examples, the method includes receiving a clock 208, wherein the frequency of the clock 208 is the same as the frequency of the CO output signal 106 and the phase of clock 208 is the same as the phase of the CO output signal 106 at block 612.

According to some examples, the method includes generating an output of the m-bit data register 210 using a value of the input of the m-bit data register at a corresponding rising edge of the clock 208 to the value of the input of the m-bit data register at block 614. According to some examples, the method includes holding the output of the m-bit data register 210 at the value of the input of the m-bit data register at the corresponding rising edge of the clock 208 to the value of the input of the m-bit data register for a time period of the clock 208 at block 616.

FIG. 7 illustrates an example method 700 in providing frequency division. Although the example method 700 depicts a particular sequence of operations, the sequence may be altered without departing from the scope of the present disclosure. For example, some of the operations depicted may be performed in parallel or in a different sequence that does not materially affect the function of the method 700. In other examples, different components of an example device or system that implements the method 700 may perform functions at substantially the same time or in a specific sequence. In various embodiments, various blocks of the described methods may be performed using various aspects of the frequency dividing circuit 200 for example with reference to FIG. 1 to FIG. 5.

According to some examples, the method includes receiving the output of the m-bit data register 210 as a first input of an adder circuit 214 at block 702. According to some examples, the method includes receiving a modified version of an output of the adder circuit 234 as a second input of the adder circuit at block 704.

According to some examples, the method includes adding the first input of the adder circuit to the second input of the adder circuit to generate the output of the adder circuit 236 at block 706. According to some examples, the method includes receiving the output of the adder circuit 236 by an m-bit flip-flop 228 at block 708.

According to some examples, the method includes receiving the clock 208 by the m-bit flip-flop 228 at block 710. According to some examples, the method includes generating the modified version of the output of the adder circuit 234 by holding a value of the output of the adder circuit at a corresponding rising edge of the clock to the value of the output of the adder circuit for the time period of the clock 208 at block 712. According to some examples, the control signal 224 is the most significant bit (MSB) in the output of the adder circuit.

According to some examples, the method includes receiving the clock 208 by a flip flop 230 at block 714. According to some examples, the method includes receiving the control signal 224 as an input of the flip flop at block 716. According to some examples, the method includes generating an output of the flip flop 238 using a value of the control signal at a corresponding rising edge of the clock to the value of the control signal and by holding the output of the flip flop at the value of the control signal 224 at the corresponding rising edge of the clock to the value of the control signal for the time period of the clock 208 at block 718.

According to some examples, the method includes receiving the clock 208 and a complement of the clock 226 as inputs of a multiplexer 232 at block 720. According to some examples, the method includes receiving the control signal 224 for selecting the clock 208 or the complement of the clock 226 to be provided on an output of the multiplexer at block 722.

According to some examples, the method includes generating the frequency dividing circuit output signal 114 by performing an AND operation between the output of the flip flop and the output of the multiplexer at block 724.

According to some examples, the method includes locking the frequency dividing circuit output signal 114 frequency with respect to a reference signal frequency provided to the frequency synthesizer 116 frequency at block 726. According to some examples, the method includes determining the oscillator output signal 106 frequency using the frequency dividing circuit output signal 114 and the reference signal frequency at block 728.

Many modifications and other embodiments of the disclosures set forth herein will come to mind to one skilled in the art to which these disclosures pertain having the benefit of teachings presented in the foregoing descriptions and the associated drawings. Although the figures only show certain components of the apparatus and systems described herein, it is understood that various other components may be used in conjunction with the system. Therefore, it is to be understood that the disclosures are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved.

Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the disclosure(s) set out in any claims that may issue from this disclosure.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

What is claimed is:

1. A frequency synthesizer comprising:
a controlled oscillator configured to generate an oscillator output signal and a complement of the oscillator output signal;
a frequency dividing circuit configured to:
receive the controlled oscillator output signal and the complement of the controlled oscillator output signal;
receive a positive binary word and a negative binary word; and
generate a frequency dividing circuit output signal from the controlled oscillator output signal and the complement of the controlled oscillator output signal using the positive binary word and the negative binary word, wherein a ratio of a frequency dividing circuit output signal frequency to a controlled oscillator output signal frequency is a decimal value greater than zero and less than one and is determined using a ratio of a value of the positive binary word to a sum of the value of the positive binary word and an absolute value of the negative binary word.

2. The frequency synthesizer of claim 1, wherein the frequency dividing circuit further comprising a first circuit, the first circuit comprising an m-bit multiplexer configured to:
receive the positive binary word and the negative binary word as inputs; and
receive a control signal for selecting the positive binary word or the negative binary word to be provided on an output of the m-bit multiplexer,
wherein each of the positive binary word and the negative binary word comprise m bits.

3. The frequency synthesizer of claim 2, wherein the first circuit further comprising an m-bit data register configured to:
receive the output of the m-bit multiplexer as an input of the m-bit data register;
receive a clock, wherein a clock frequency is the same as the controlled oscillator output signal frequency and a clock phase is the same as a controlled oscillator output signal phase;
generate an output of the m-bit data register using a value of the input of the m-bit data register at a corresponding rising edge of the clock to the value of the input of the m-bit data register; and
hold the output of the m-bit data register at the value of the input of the m-bit data register at the corresponding rising edge of the clock to the value of the input of the m-bit data register for a time period of the clock.

4. The frequency synthesizer of claim 3, wherein the frequency dividing circuit further comprising a second circuit, the second circuit comprising an adder circuit and an m-bit flip flop, wherein:
the adder circuit is configured to:
receive the output of the m-bit data register as a first input of the adder circuit;
receive a modified version of an output of the adder circuit as a second input of the adder circuit; and
add the first input of the adder circuit to the second input of the adder circuit to generate the output of the adder circuit; and
the m-bit flip flop is configured to:
receive the output of the adder circuit;
receive the clock; and
generate the modified version of the output of the adder circuit by holding a value of the output of the adder circuit at a corresponding rising edge of the clock to the value of the output of the adder circuit for the time period of the clock.

5. The frequency synthesizer of claim 4, wherein the control signal is a most significant bit (MSB) in the output of the adder circuit.

6. The frequency synthesizer of claim 5, wherein the frequency dividing circuit further comprising a third circuit, the third circuit comprising:
a flip flop configured to:
receive the clock and receive the control signal as an input of the flip flop; and
generate an output of the flip flop using a value of the control signal at a corresponding rising edge of the clock to the value of the control signal and by holding the output of the flip flop at the value of the control signal at the corresponding rising edge of the clock to the value of the control signal for the time period of the clock; and
a multiplexer configured to:
receive the clock and a complement of the clock as inputs; and
receive the control signal for selecting the clock or the complement of the clock to be provided on an output of the multiplexer.

7. The frequency synthesizer of claim 6, wherein the third circuit comprising an AND logic gate configured to receive the output of the flip flop and the output of the multiplexer and generate the frequency dividing circuit output signal by performing an AND operation between the output of the flip flop and the output of the multiplexer.

8. The frequency synthesizer of claim 7 further comprising a phase locked loop configured to determine the controlled oscillator output signal frequency using the frequency dividing circuit output signal and a reference signal provided to the frequency synthesizer, wherein the phase locked loop is configured to lock the frequency dividing circuit output signal frequency with respect to the reference signal frequency.

9. A method for frequency synthesis, the method comprising:
receiving a controlled oscillator output signal and a complement of the controlled oscillator output signal;
receiving a positive binary word and a negative binary word; and
generating a frequency dividing circuit output signal from the controlled oscillator output signal and the complement of the controlled oscillator output signal using the positive binary word and the negative binary word, wherein a ratio of a frequency dividing circuit output signal frequency to a controlled oscillator output signal frequency is a decimal value greater than zero and less than one and is determined using a ratio of a value of the positive binary word to a sum of the value of the positive binary word and an absolute value of the negative binary word.

10. The method for frequency synthesis of claim 9, comprising:
receiving the positive binary word and the negative binary word as inputs; and
receiving a control signal for selecting the positive binary word or the negative binary word to be provided on an output of an m-bit multiplexer,
wherein each of the positive binary word and the negative binary word comprise m bits.

11. The method for frequency synthesis of claim 10, comprising:
receiving the output of the m-bit multiplexer as an input of an m-bit data register;
receiving a clock, wherein a clock frequency is the same as the controlled oscillator output signal frequency and a clock phase is the same as a controlled oscillator output signal phase;
generating an output of the m-bit data register using a value of the input of the m-bit data register at a corresponding rising edge of the clock to the value of the input of the m-bit data register; and
holding the output of the m-bit data register at the value of the input of the m-bit data register at the corresponding rising edge of the clock to the value of the input of the m-bit data register for a time period of the clock.

12. The method for frequency synthesis of claim 11, comprising:
receiving the output of the m-bit data register as a first input of an adder circuit;
receiving a modified version of an output of the adder circuit as a second input of the adder circuit; and
adding the first input of the adder circuit to the second input of the adder circuit to generate the output of the adder circuit;
receiving the output of the adder circuit by an m-bit flip flop;
receiving the clock by the m-bit flip flop; and
generating the modified version of the output of the adder circuit by holding a value of the output of the adder circuit at a corresponding rising edge of the clock to the value of the output of the adder circuit for the time period of the clock.

13. The method for frequency synthesis of claim 12, wherein the control signal is a most significant bit (MSB) of the output of the adder circuit.

14. The method for frequency synthesis of claim 13, comprising:

receiving the clock by a flip flop;
receiving the control signal as an input of the flip flop;
generating an output of the flip flop using a value of the control signal at a corresponding rising edge of the clock to the value of the control signal and by holding the output of the flip flop at the value of the control signal at the corresponding rising edge of the clock to the value of the control signal for the time period of the clock;
receiving the clock and a complement of the clock as inputs of a multiplexer; and
receiving the control signal for selecting the clock or the complement of the clock to be provided on an output of the multiplexer.

15. The method for frequency synthesis of claim 14, comprising generating the frequency dividing circuit output signal by performing an AND operation between the output of the flip flop and the output of the multiplexer.

16. The method for frequency synthesis of claim 15, comprising:
locking the frequency dividing circuit output signal frequency with respect to a reference signal frequency provided to a frequency synthesizer frequency; and
determining the controlled oscillator output signal frequency using the frequency dividing circuit output signal and the reference signal frequency.

17. A frequency dividing circuit comprising a first circuit, the first circuit comprising an m-bit multiplexer configured to receive a positive binary word and a negative binary word as inputs;
wherein the frequency dividing circuit is configured to:
receive a controlled oscillator output signal and a complement of the controlled oscillator output signal;
generate a frequency dividing circuit output signal from the controlled oscillator output signal and the complement of the controlled oscillator output signal using the positive binary word and the negative binary word, wherein a ratio of a frequency dividing circuit output signal frequency to a controlled oscillator output signal frequency is a decimal value greater than zero and less than one and is determined using a ratio of a value of the positive binary word to a sum of the value of the positive binary word and an absolute value of the negative binary word.

18. The frequency dividing circuit of claim 17, wherein the m-bit multiplexer is configured to receive a control signal for selecting the positive binary word or the negative binary word to be provided on an output of the m-bit multiplexer, wherein each of the positive binary word and the negative binary word comprise m bits, and wherein the first circuit further comprising an m-bit data register configured to:
receive the output of the m-bit multiplexer as an input of the m-bit data register;
receive a clock, wherein a clock frequency is the same as the controlled oscillator output signal frequency and a clock phase is the same as a controlled oscillator output signal phase;
generate an output of the m-bit data register using a value of the input of the m-bit data register at a corresponding rising edge of the clock to the value of the input of the m-bit data register; and
hold the output of the m-bit data register at the value of the input of the m-bit data register at the corresponding rising edge of the clock to the value of the input of the m-bit data register for a time period of the clock.

19. The frequency dividing circuit of claim 18, wherein the frequency dividing circuit comprising:
- a second circuit, the second circuit comprising an adder circuit and an m-bit flip flop, wherein:
- the adder circuit is configured to:
- receive the output of the m-bit data register as a first input of the adder circuit;
- receive a modified version of an output of the adder circuit as a second input of the adder circuit; and
- add the first input of the adder circuit to the second input of the adder circuit to generate the output of the adder circuit, wherein the control signal is a most significant bit (MSB) of the output of the adder circuit; and
- the m-bit flip flop is configured to:
- receive the output of the adder circuit;
- receive the clock; and
- generate the modified version of the output of the adder circuit by holding a value of the output of the adder circuit at a corresponding rising edge of the clock to the value of the output of the adder circuit for the time period of the clock; and
- a third circuit, the third circuit comprising:
- a flip flop configured to:
- receive the clock and receive the control signal as an input of the flip flop; and
- generate an output of the flip flop using a value of the control signal at a corresponding rising edge of the clock to the value of the control signal and by holding the output of the flip flop at the value of the control signal at the corresponding rising edge of the clock to the value of the control signal for the time period of the clock; and
- a multiplexer configured to:
- receive the clock and a complement of the clock as inputs; and
- receive the control signal for selecting the clock or the complement of the clock to be provided on an output of the multiplexer.

20. The frequency dividing circuit of claim 19, wherein the third circuit comprising an AND logic gate configured to receive the output of the flip flop and the output of the multiplexer and generate the frequency dividing circuit output signal by performing an AND operation between the output of the flip flop and the output of the multiplexer.

* * * * *